US009834847B2

(12) United States Patent
Huyghebaert et al.

(10) Patent No.: US 9,834,847 B2
(45) Date of Patent: Dec. 5, 2017

(54) NANOWIRE CLUSTER AND TEMPLATE AND METHOD FOR NANOWIRE CLUSTER FORMATION

(71) Applicants: IMEC VZW, Leuven (BE); King Abdulaziz City for Science and Technology, Riyadh (SA)

(72) Inventors: Cedric Huyghebaert, Leuven (BE); Alaa Abd-Elnaiem, Leuven (BE); Philippe Vereecken, Liege (BE)

(73) Assignees: IMEC VZW, Leuven (BE); King Abdulaziz City of Science and Technology, Riyadh (SA)

( * ) Notice: Subject to any disclaimer, the term of this patent is extended or adjusted under 35 U.S.C. 154(b) by 0 days.

(21) Appl. No.: 14/814,362

(22) Filed: Jul. 30, 2015

(65) Prior Publication Data
US 2016/0032475 A1    Feb. 4, 2016

(30) Foreign Application Priority Data

Jul. 31, 2014    (EP) .................................... 14179382

(51) Int. Cl.
| | | |
|---|---|---|
| *C25D 1/20* | (2006.01) | |
| *C25D 1/00* | (2006.01) | |
| *B82Y 10/00* | (2011.01) | |
| *B82Y 40/00* | (2011.01) | |
| *H01L 29/66* | (2006.01) | |

(Continued)

(52) U.S. Cl.
CPC .............. *C25D 1/006* (2013.01); *B82Y 10/00* (2013.01); *B82Y 40/00* (2013.01); *C25D 11/045* (2013.01); *H01B 1/023* (2013.01); *H01B 5/002* (2013.01); *H01L 29/0676* (2013.01); *H01L 29/1029* (2013.01); *H01L 29/413* (2013.01); *H01L 29/66439* (2013.01); *H01L 29/66469* (2013.01); *H01M 4/661* (2013.01); *H01M 4/70* (2013.01); *C25D 1/20* (2013.01); *C25D 3/12* (2013.01); *C25D 11/005* (2013.01); *C25D 11/24* (2013.01);
(Continued)

(58) Field of Classification Search
CPC ............ C25D 1/006; C25D 1/20; C25D 3/12; C25D 11/005; C25D 11/24; B82Y 10/00; B82Y 40/00; H01B 1/023; H01B 5/002
USPC ............................... 174/36; 29/825; 205/118
See application file for complete search history.

(56) References Cited

U.S. PATENT DOCUMENTS 7,636,214 B2    12/2009    Imada et al.
8,168,495 B1    5/2012    Lim et al.
(Continued)

FOREIGN PATENT DOCUMENTS

WO    2012016160 A2    2/2012
WO    2012/099655 A1    7/2012

OTHER PUBLICATIONS

Liang, Yongqi et al., "Preparation of Free-Standing Nanowire Arrays on Conductive Substrates", J. Am. Chem. Soc., vol. 126, 2004, pp. 16338-16339.
(Continued)

*Primary Examiner* — William H Mayo, III
(74) *Attorney, Agent, or Firm* — McDonnell Boehnen Hulbert & Berghoff LLP

(57) ABSTRACT

A cluster of non-collapsed nanowires, a template to produce the same, methods to obtain the template and to obtain the cluster by using the template, and devices having the cluster. The cluster and the template both have an interconnected region and an interconnection-free region.

19 Claims, 16 Drawing Sheets

(51) Int. Cl.
*H01L 29/06* (2006.01)
*H01L 29/10* (2006.01)
*H01L 29/41* (2006.01)
*C25D 11/04* (2006.01)
*H01B 1/02* (2006.01)
*H01B 5/00* (2006.01)
*H01M 4/66* (2006.01)
*H01M 4/70* (2006.01)
*H01M 4/131* (2010.01)
*H01M 10/052* (2010.01)
*H01M 4/02* (2006.01)
*C25D 3/12* (2006.01)
*C25D 11/24* (2006.01)
*C25D 11/00* (2006.01)

(52) U.S. Cl.
CPC .......... *H01M 4/131* (2013.01); *H01M 10/052* (2013.01); *H01M 2004/028* (2013.01)

(56) References Cited

U.S. PATENT DOCUMENTS

| | | | | |
|---|---|---|---|---|
| 2005/0136608 A1* | 6/2005 | Mosley | ................... | H01G 4/10 438/381 |
| 2005/0136609 A1* | 6/2005 | Mosley | ................... | H01G 4/10 438/381 |
| 2005/0276743 A1* | 12/2005 | Lacombe | ............... | B82Y 30/00 423/447.3 |
| 2011/0033674 A1 | 2/2011 | Goyal et al. | | |
| 2011/0189858 A1 | 8/2011 | Yasseri et al. | | |
| 2013/0220821 A1* | 8/2013 | Cho | ......................... | C25D 1/04 205/122 |
| 2014/0374268 A1* | 12/2014 | Wu | .......................... | C25D 1/04 205/118 |

OTHER PUBLICATIONS

Nur Ubaidah Saidin et al., "Anodic Aluminum Oxide Templates for Nickel Nanowires Array Fabrication", Advanced Materials Research, vol. 364, 2012, pp. 303-307.

European Search Report, European Patent Application No. 14179382.8, dated Oct. 9, 2014.

Wang, Kaiying et al., "Electrochemical Engineering of Hollow Nanoarchitectures: Pulse/Step Anodization (Si, Al, Ti) and Their Applications", Chemical Society Reviews, vol. 43, No. 5, Dec. 13, 2013, pp. 1476-1500.

Xing, Hu et al., "Fabrication of Three Dimensional Interconnected Porous Carbons from Branched Anodic Aluminum Oxide Template", Electrochemistry Communications, vol. 13, 2011, pp. 1082-1085.

Asoh, Hidetaka et al., "Design of Two-Dimensional/Three-Dimensinoal Composite Porous Alumina by Colloidal Crystal Templating and Subsequent Anodization", Appl Phys. Lett., vol. 87, No. 10, 2005, pp. 103102-1-103102-3.

Sun, Ziqi et al., "Morphology-Controllable 1D-3D Nanostructured TiO2 Bilayer Photoanodes for Dye-Sensitized Solar Cells", Chem. Commun., vol. 49, 2013, pp. 966-968.

* cited by examiner

NANOWIRE CLUSTER AND TEMPLATE AND METHOD FOR NANOWIRE CLUSTER FORMATION

CROSS-REFERENCE TO RELATED APPLICATIONS

The present application is a non-provisional patent application claiming priority to European Patent Application No. 14179382.8 filed Jul. 31, 2014, the contents of which are hereby incorporated by reference.

TECHNICAL FIELD OF THE DISCLOSURE

The present disclosure relates to the field of nanowire fabrication

BACKGROUND OF THE DISCLOSURE

In recent years, one-dimensional nanowires have attracted much research interest due to their very large aspect ratio and surface area conferring them with unique magnetic, electronic, and optoelectronic properties. For instance, Au, Ag, Cu and semiconductor nanowires show unique electron transport capabilities, not observed in the corresponding bulk materials; and ferromagnetic nanowires such as Ni, Co and Fe-based nanowires are candidates of choice for magnetic field sensors.

Known methods enabling the fabrication of such nanowires include, for instance, NUR Ubaidah Saidin et al. (Adv. Mat. Res. Vol. 364 (2012) pp. 303-307), which discloses a process developed to fabricate anodic aluminium oxide (AAO) templates suitable for the fabrication of nanowire arrays. In this reference, an anodization process was used to fabricate an AAO template with pore diameters ranging from 15 nm to 30 nm. Electrodeposition of parallel arrays of high aspect ratio nickel nanowires was demonstrated using these fabricated AAO templates.

However, a potential issue for such template-based methods is that the higher the aspect ratio of the nanowires, the more they tend to collapse during their separation from the template. This collapse is an aggregation of the free extremities of the nanowires, thereby forming separate bundles of nanowires. Without being bound by theory, this collapse is believed to be due to the mutual attraction between those nanowires and to the surface tensile force in the drying process. An example of this collapse is illustrated in FIGS. 12 and 13.

One approach that may help to avoid this collapse is mentioned in Yongqi Liang et al. (J. Am. Chem. Soc., 2004, 126 (50), pp 16338-16339) where a supercritical drying technique is combined with AAO. This technique is however relatively expensive as it involves advanced equipment. Furthermore, this technique is not easily adaptable to large substrate sizes and to industrial-scale manufacturability. For example, this technique does not appear to be practically usable for large area foil processing such as roll-to-roll (RtR) processing.

There is therefore a desire new methods enabling the fabrication of a cluster of non-collapsed nanowires while avoiding known drawbacks of conventional techniques

SUMMARY OF THE DISCLOSURE

Examples of the present disclosure may provide good templates for the fabrication of a cluster of non-collapsed nanowires. The present disclosure also relates to methods for manufacturing such templates, and to providing a cluster of non-collapsed nanowires.

A potential advantage of embodiments of the present disclosure is that a cluster of spaced nanowires can be obtained that is structurally stable and therefore collapse-resistant. The present disclosure also relates to a relatively cheap production of a non-collapsed nanowire cluster.

A further potential advantage of embodiments of the present disclosure is that nanowire clusters (or arrays) and devices comprising the same can be fabricated on foils, thereby allowing manufacturability via sheet to sheet processing and roll to roll processing, for example.

Another potential advantage of embodiments of the present disclosure is that the obtained collapse-resistant cluster of nanowires is relatively easy to coat (e.g. via a surface limited deposition technique such as Atomic Layer Deposition (ALD)).

In a first aspect, the present disclosure relates to a cluster of spaced nanowires aligned longitudinally along a direction (X), the cluster comprising at least a first region and a second region positioned subsequently along the longitudinal direction (X), the nanowires of the first region being interconnected and the nanowires of the second region being free of interconnections.

In a second aspect, the present disclosure relates to a template for forming a cluster of spaced nanowires aligned longitudinally along a direction (X), the template comprising an assembly of two contiguous layers, the first layer comprising a network of aligned interconnected channels and the second layer comprising a cluster of aligned channels which are free of interconnections.

In a third aspect, the present disclosure relates to a method for forming a cluster of aligned nanowires, the method comprising forming nanowires in a template according to any embodiment of the second aspect.

In a fourth aspect, the present disclosure relates to a method for manufacturing a template according to any embodiment of the second aspect. In a first mode of realization, the method may comprise anodizing an assembly of two contiguous layers, the first layer being made of a material forming a network of interconnected channels upon anodization and the second layer being made of a material forming a cluster of aligned separated channels upon anodization.

In a fifth aspect, the present disclosure relates to devices comprising a cluster of spaced nanowires according to the first aspect.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
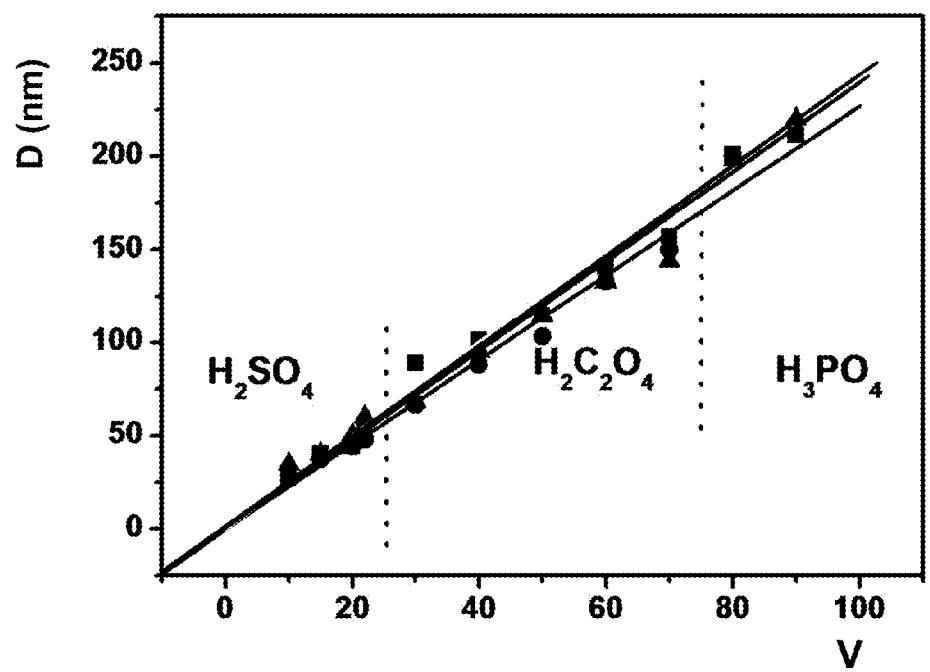
FIG. 1 is a graph of the inter-channel distance versus the voltage applied according to embodiments of the present disclosure.

In the different figures, the same reference signs refer to the same or analogous elements, unless context dictates otherwise.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "nanowire" relates to a nanostructure having the shape of a rod, an aspect ratio of at least 20, and a width or diameter of at most 500 nm. A nanowire can be plain or hollow. When hollow, nanowires are sometimes referred to as nanotubes.

As used herein and unless provided otherwise, the term "anodization" when applied to an anodizable material (such as an aluminium-containing layer) refers to an electrochemical process comprising applying a potential between an anodizable material (to be anodized) (e.g. aluminium-containing layer) functioning as the working electrode and a counter-electrode in presence of an acid electrolyte. This method leads to the formation of a cluster of channels arranged in an orderly fashion (e.g. hexagonally) perpendicularly to the surface of the layer. This cluster is typically called an array due to the orderly nature of the arrangement.

In a first aspect, the present disclosure relates to a cluster (or array) of spaced nanowires aligned longitudinally along a direction (X), the cluster comprising at least a first region and a second region positioned subsequently along the longitudinal direction (X), the nanowires of the first region being interconnected and the nanowires of the second region being free of interconnections.

Having a region composed of interconnected nanowires is advantageous to prevent the nanowires of the second region to collapse. However, having the complete cluster (first and second region) composed of interconnected nanowires may not be adequate for at least the following reasons:
  there would be too much capacitive and inductive coupling between the nanowires,
  interconnected nanowires are very difficult to coat uniformly and without introducing pinholes. This remains true even when surface limited deposition techniques such as Atomic Layer Deposition (ALD) are used. This in turn makes the formation of a Metal-Insulator-Metal (MIM) based on the nanowires very difficult.

It is a potential advantage of embodiments of the present disclosure that the obtained collapse-resistant cluster of nanowires is relatively easy to coat (e.g. via (ALD)) compared to a fully interconnected nanowire network. For instance, a thin-film stack (e.g. a MIM capacitor stack) can be coated uniformly and free of pinholes on the second region.

The interconnections between the nanowires of the first region are typically interconnections between two otherwise separated nanowires. The interconnections are more typically interconnections between two otherwise separated nanowires, each of the nanowires having its own base (typically in contact with a substrate) and its own tip (typically away from the substrate) not commonly owned between the two nanowires. This means that two nanowires merging into a single nanowire, or a single nanowire branching into two nanowires are not considered as interconnected nanowires. Preferably, the nanowires of the present disclosure are not merging with one another and are not branching out. Such branching and merging do occasionally occur when the template used to form the cluster is such that the second layer is made of a material comprising less than 99.9 at % aluminium. The higher the aluminium content in that layer of the template, the less branching/merging occur in the template and therefore also in the cluster obtained therefrom. When pure aluminium is used, no branching/merging is observed. Similarly, such branching and merging do occasionally occur when the first layer comprises 0.1% or more of other materials than aluminium and copper. As a consequence, the material of the second layer is preferably made of pure aluminium and the material of the first layer is preferably only made of aluminium (and optionally copper if the template is made via the first mode of realization). The nanowires are spaced. This means that they are separated in space from one another. In the first region the nanowires are spaced by interconnections while in the second region no interconnections are present and the nanowires are therefore spaced by a surrounding medium (which is air in the case of the structure obtained directly after removal of the aluminium oxide template but which is more typically a solid material of interest subsequently provided between the nanowires) (see FIG. 15, middle, where $SiO_2$ is the surrounding medium). The interconnections are typically made of the same material as the nanowires themselves. Most typically, the interconnections are nanowires themselves. Hence, the nanowires of the first region may form a three dimensional nanowire mesh while the nanowires of the second region are free of interconnections. However, in order to avoid confusion in the rest of the present description, the term "nanowires", unless indicated otherwise, will refer to the nanowires aligned longitudinally along the direction (x).

The average inter-distance between the central longitudinal axes of any two neighbouring nanowires (also defined as pitch) may for instance be from 20 nm to 500 nm and is typically from 50 nm to 250 nm.

Figure 6:
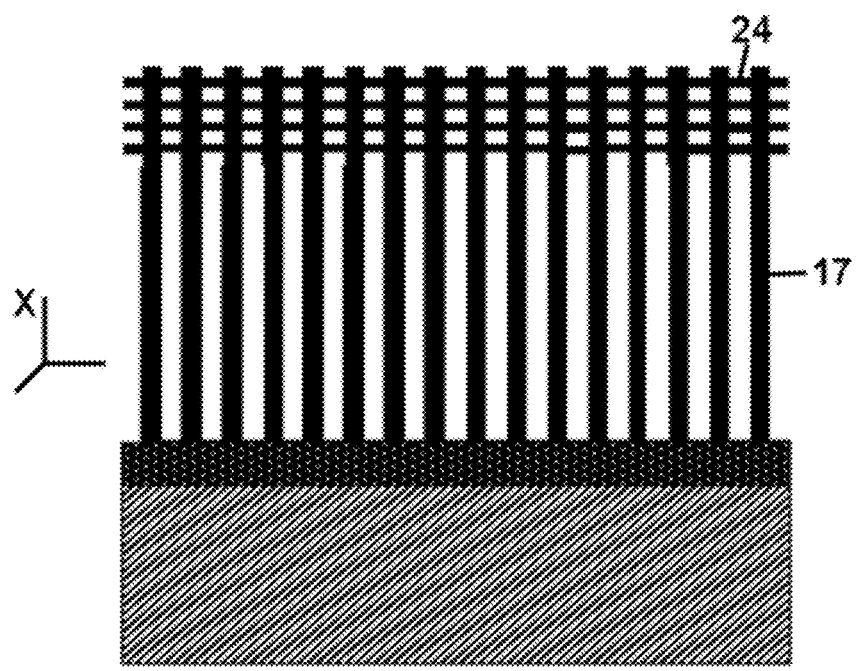

In embodiments when the nanowires abut a substrate, the longitudinal direction (X) may make an angle of from 60° to 90° with the substrate surface on which the nanowires abut. Preferably, this angle is from 80° to 90° and more preferably substantially 90°. In preferred embodiments, the nanowires may stand perpendicularly on a substrate and the second region may comprise the area where the nanowires contact the substrate. Such an embodiment is illustrated in FIG. 6. These embodiments are advantageous because the interconnections completely prevent nanowire collapsing, a problem arising during wetting and drying steps in the processing of nanowires.

In embodiments, the cluster of spaced nanowires may comprise three regions positioned subsequently along the longitudinal direction (X), the nanowires of the first and of a third region being interconnected and the nanowires of the second region being free of interconnections, wherein the second region is sandwiched between the first and the third region. In these embodiments, the nanowires may stand perpendicularly on a substrate and the first (or third) region may comprise an area where interconnected nanowires (a nanowire three-dimensional mesh) contact the substrate. These embodiments provide a cluster of nanowires which is structurally reinforced at its base, thereby further reducing its tendency to collapse.

In other embodiments, the first interconnected region may be along the longitudinal direction (X) in such a way as to be in between two regions free of interconnections. Although not preferred, such embodiments still prevent nanowire collapse to some extent.

In other embodiments, there is no substrate and the cluster of spaced nanowires is free standing.

In embodiments, the second region (and therefore the nanowire portion within the non-interconnected region of the cluster along the longitudinal direction (X)) may have a length of 1 µm or more. Typically, it may have a length of from 1 µm to 100 µm or 10 µm to 100 µm. The problem of the collapsing nanowires is particularly observable for nanowire lengths of at least 1 µm and become exacerbated for lengths of at least 10 µm.

In embodiments, the first region (and optional third region) may have a length along the longitudinal direction (X) of from 20 nm to 1 µm. The ratio between the length of the second region and the length of the first region may for instance be a value in the range from 1 to 100, preferably from 5 to 20.

In embodiments, the nanowires may have an aspect ratio of 20 or more, preferably of 30 or more, yet more preferably of 50 or more.

In embodiments, the nanowires may have a diameter of from 10 nm to 300 nm, preferably from 50 to 200 nm.

In preferred embodiments, the nanowires in the second region are the prolongation of the interconnected nanowires of the first region. This is however not necessarily the case. For instance, the inter-distance between the nanowires in the second region can be made different from the inter-distance between the interconnected nanowires of the first region by using a different voltage for the two regions during the anodized aluminium oxide (AAO) formation.

Figure 15:
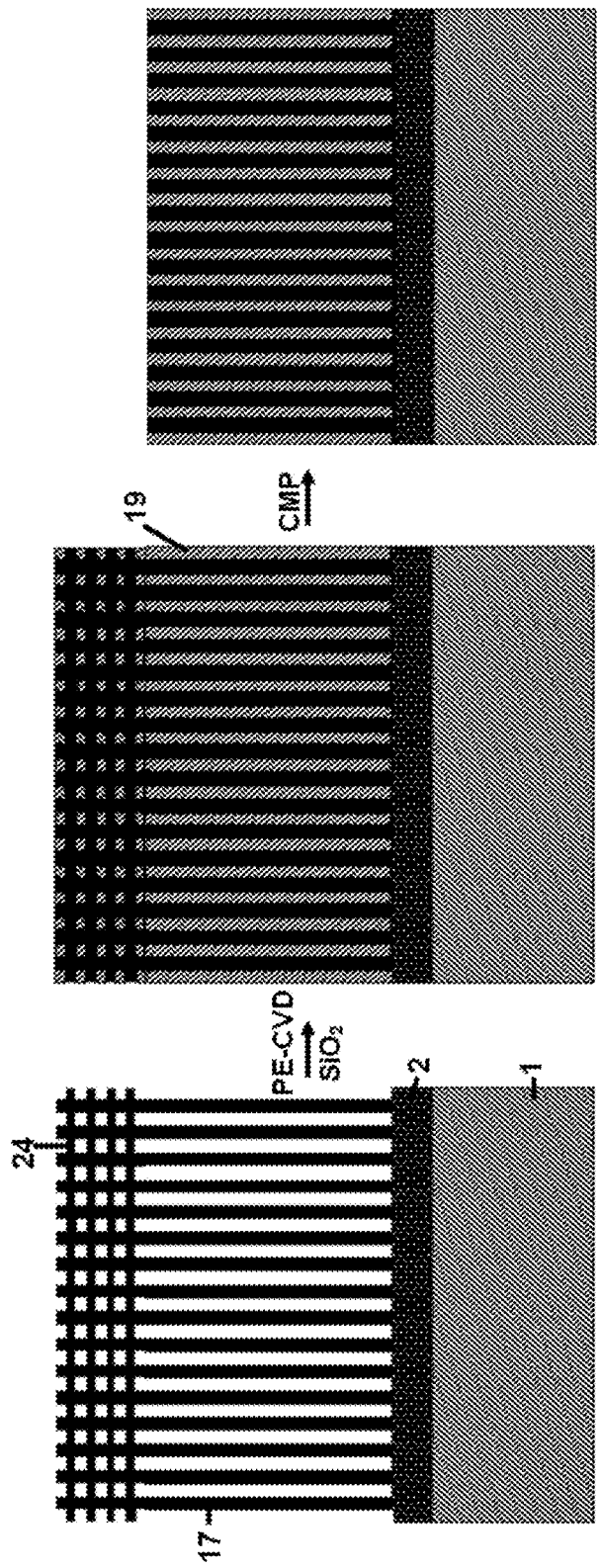
FIG. 15 is a schematic representation of a method for forming an interconnections-free cluster of metal nanowires according to an embodiment of the present disclosure.

In embodiments, the nanowires are not collapsed. In other words, the extremities of the nanowires are not aggregated. This is depicted in FIG. 15 (right). In embodiments, the variance for the inter-distance between each pair of neighboring nanowires in the second region may remain substantially constant along the entire length of the second region measured along the longitudinal direction (X). In embodiments, the variance measured at one end of the nanowires may for instance be within 30%, preferably within 20%, yet more preferably within 10% and most preferably within 5% of the variance measured at the other end of the nanowires. In other words, the nanowires may be substantially parallel along the longitudinal direction (X).

In embodiments, the nanowires may be made of metals, semiconductor materials (e.g. Si, InP, GaN, GaAs . . . ), dielectric materials (e.g. $SiO_2$, $TiO_2$, . . . ), polymers (e.g. PMMA) or biomolecules (e.g. DNA). It can also be made of a combination thereof (e.g. nanowires made of a metal core and a dielectric shell). Preferably, the nanowires comprise a metal or are made of a metal. Preferably the metal is selected so that it can be grown by electrochemical deposition within the template. Examples of suitable metals are Au, Ag, Pt, Cu, Ni, Al, Co, Fe, Sn, Ti and alloys thereof. Al and Ti require ionic liquids for the electrochemical deposition. Multilayered nanowires are also possible (e.g. with alternating layers of different compositions along the longitudinal direction (x)). For cost effective technological applications, the preferred metals are Cu, Ni and Co. Both electroplating and electroless plating can be used. Electroless plating can for instance be used when the substrate (e.g. Al, or TiN) is suitably catalytic or made catalytic for the nucleation of a first metal layer. The autocatalytic electroless deposition process can then continue from this first metal layer to fill the porous template.

In a second aspect, the present disclosure relates to a template for forming a cluster of spaced nanowires aligned longitudinally along a direction (X), the template comprising an assembly of two contiguous layers, the first layer comprising a network of aligned interconnected channels and the second layer comprising a cluster of aligned separated channels.

In embodiments, the first layer is preferably on top of the second layer. The interconnections in the first layer are pores connecting the channels. These pores typically extend perpendicularly to the longitudinal direction (X) and are channel-like.

Also, for every location on a channel along the longitudinal direction (X) where a pore is present, two additional pores are typically also present so that altogether, three pores are typically present at each of the location, the three pores connecting each channel to three neighbouring channels. These three pores typically are at an equal distance from each other.

The pores present at subsequent location on a channel along the longitudinal direction (X) are typically in average spaced from one another along the longitudinal direction (X) by a distance (Dip) equal to from 0.5 to 2.0 times the average inter-distance (Dic) between the central longitudinal axes of any two neighbouring channels. In embodiments, Dip may be from 10 nm to 1 µm and is typically from 25 nm to 500 nm.

In embodiments, the average inter-distance between the central longitudinal axes of any two neighbouring channels may be from 20 nm to 500 nm and is typically from 50 nm to 250 nm.

In embodiments, the aligned separated channels are the prolongation of the aligned interconnected channels. In other words, the central longitudinal axes of the aligned separated channels are the prolongation of the central longitudinal axis of the aligned interconnected channels.

In embodiments, the second layer may have a thickness of 1 µm or more (measured along direction (X)). Typically, it may have a thickness of from 1 µm to 100 µm or 10 µm to 100 µm.

In embodiments, the first layer may have a thickness along the direction (X) of from 20 nm to 1 µm. The ratio between the thickness of the second layer and the thickness of the first layer may for instance be a value in the range from 1 to 100, preferably from 5 to 20.

In embodiments, the assembly may be on a substrate. In embodiments, the top surface of the substrate may be conductive in order to allow for electroless deposition. For instance, the top surface of the substrate may comprise Al or TiN. The substrate may for instance comprise a silicon wafer coated with TiN. As another example of particular industrial significance, the substrate may be composed of a plastic base coated with TiN (deposited e.g. by sputtering) and laminated with aluminium. As yet another example of particular industrial significance, the substrate can be made of aluminium. To have a substrate made of aluminium, one can start the template manufacturing process from an aluminium foil which will be partially anodized to form the channels and to leave a part which is not anodized and which can serve as a substrate. An advantage of starting from an aluminium foil and therefore of having a metal foil as a substrate is that a very thick layer of channels (or nanowires) can be obtained. Physical vapour deposited layers have thicknesses of typically up to a few microns which can be extended to a few tens of microns maximum by Al electroplating from an ionic liquid. The foils on the other hand can be a few hundred microns thick.

Preferably, the second layer is in contact with the substrate. When a third layer is present (in order to form clusters of nanowires having a third region), the third layer or the first layer may be in contact with the substrate.

In a third aspect, the present disclosure relates to a method for forming (e.g. growing) a cluster of aligned nanowires, the method comprising forming nanowires in a template according to any embodiment of the second aspect.

In embodiments, forming nanowires may comprise providing a metal, a semi-conductor or a dielectric material in the template. Various methods may be used to form the material in the template. For instance, metal nanowires (e.g. Ni) can be formed by electrochemical deposition; semiconductor nanowires (e.g. Si) can be formed by CVD or PE-CVD; dielectric materials can be formed in a two step process involving an electrochemical deposition step (of a metal) and an oxidation step (of the metal). Nanowires having a metal core and a dielectric shell can be formed for instance by a combination of ALD (e.g. for the dielectric shell) and electrochemical deposition (for the metal core). Nanowires formed of two or more materials can also be formed. For instance, magnetoresistive nanowires can be formed by alternating deposition of magnetic material and non-magnetic materials in the template.

In embodiments, the method may further comprise after the step of forming the nanowires, a step of dissolving the template.

In a fourth aspect, the present disclosure relates to a method for manufacturing a template according to any embodiment of the second aspect.

In a first mode of realization (see FIG. 22), the method may comprise anodizing an assembly of two contiguous layers, the first layer 4 being made of a material forming a network of interconnected channels upon anodization and the second layer 3 being made of a material forming a cluster of aligned separated channels upon anodization.

In embodiments, the anodizing may be performed under potentiostatic or galvanostatic control.

In embodiments, the second layer 3 may be made of a material comprising from 98.0 to 100 at % aluminum, and from 0.0 to 2.0 at % of other materials. The other materials being such that no network of interconnected channels form upon anodization of the second layer. Further, the first layer 4 may be made of a material comprising from 95.0 to 99.9 at % aluminum, and from 0.1 to 5.0 at % copper. In one example, the second layer 3 may be made of a material comprising from 99.0 to 100% aluminium, and from 0.0 to 1.0% of other materials, the other materials being such that no network of interconnected channels form upon anodization of the second layer. In another example, the second layer 3 may be made of a material comprising from 99.5 to 100% aluminium, and from 0.0 to 0.5% of other materials, the other materials being such that no network of interconnected channels form upon anodization of the second layer. In yet another example, the second layer 3 may be made of a material comprising from 99.9 to 100% aluminium, and from 0.0 to 0.1% of other materials, the other materials being such that no network of interconnected channels form upon anodization of the second layer. Pure aluminium may be used for the second layer as it produces straighter channels, without branching.

In embodiments, the other material may be any metallic and non-metallic impurity other than Cu e.g. Si, Ge, Au, Fe, Mo and preferably no intentional impurity doping. According to one example, the first layer 4 may be made of a material comprising from 98.0 to 99.9 at % aluminium, and from 0.1 to 2.0 at % copper. In another example, the first layer 4 may be made of a material comprising from 99.0 to 99.9 at % aluminium, and from 0.1 to 1.0 at % copper. In a further example, the first layer 4 may be made of a material comprising from 99.5 to 99.9 at % aluminium, and from 0.1 to 0.5 at % copper. These at % can be measured for instance by Rutherford backscattering spectroscopy (RBS).

In a second mode of realization (see FIG. 23), the method may comprise: (1) anodizing a first part of a layer of an anodizable material by using a periodically modulating voltage (or current) in such a way as to form aligned separated channels; (2) opening pores within the first part in such a way that the pores are perpendicular to the channels, and (3) anodizing a second part of the layer, the second part being contiguous to the first part, by using continuous current (or voltage) for a time sufficient to form aligned separated channels.

Examples of anodizable materials suitable for use in embodiments of either modes of realization of the fourth aspect are aluminum, titanium, silicon and III-V semiconductors such as GaAs, GaP, GaN, Aluminum may be preferred.

In embodiments of either modes of realization, the anodizing may be performed in presence of an electrolyte, and at a temperature of from 0 to 50° C., for example.

In embodiments of either modes of realization, the anodization produces a barrier layer and the barrier layer is removed from the template. This barrier layer is a layer of metal oxide present at the interface between the formed channel and the substrate. If this barrier is not removed, the nanowires would be electrically isolated from the substrate, which is not desired in many applications. Filling the channels with a metal is most conveniently performed by taking advantage of the metallic nature of the substrate. However, some methods such as pulse plating permit to fill the channels with the barrier still present.

In a fifth aspect, the present disclosure relates to a device comprising either a cluster of spaced nanowires (17) according to any one of originally filed claims 1 to 4 or a cluster of non-collapsed spaced nanowires (17) free of interconnections (24) and aligned longitudinally along a direction (X).

In embodiments, the device may comprise an interconnections-free cluster of non-collapsed nanowires. A method to obtain such an interconnections-free cluster is described in example 5.

In embodiments, the device may be a Metal-Insulator-Metal (MIM) super-capacitor comprising a cluster of metal nanowires according to any embodiment of the first aspect, the cluster of metal nanowires being coated by a dielectric material (e.g. a high-k dielectric material), and the remaining space between the nanowires being filled by a metal. A method to obtain such a MIM is described in example 6.

In embodiments, the device may comprise a cluster of nanowires according to any embodiment of the first aspect, the nanowires forming cores and carbon nanotubes forming shells around the cores. For instance, the nanowires in these embodiments may be made of a metal. Preferred metals are Cu and Ni. A method to obtain such a device is described in example 7.

In embodiments, a method to obtain such a device may comprise providing a cluster of nanowires according to any embodiment of the first aspect, coating the nanowires with at least one graphene layer (e.g. via chemical vapour deposition), filling the space between the coated nanowires with a dielectric (e.g. $SiO_2$), removing the first region (e.g. by CMP), and removing the nanowires (e.g. by chemical etching).

In embodiments, the device may be a resistive switching memory comprising a cluster of nanowires according to any embodiment of the first aspect. For instance the resistive switching memory may comprise transition metal oxide nanowires according to embodiments of the present disclosure (e.g. nickel oxide or titanium oxide) wherein the space between the nanowires is filled with a different dielectric material (e.g. $SiO_2$). A method to obtain such a device is described in example 8.

In embodiments, the device may be a magnetoresistive random-access memory device. For instance, it may comprise nanowires according to embodiments of the present disclosure, said nanowires comprising alternating magnetic material layers and non-magnetic metal layers. A method to obtain such a device is described in example 9.

In embodiments, the device may be a battery such as a thin-film lithium ion battery where the nanowires are the current collectors. The nanowires are coated with either a single active electrode layer (e.g. $MnO_2$ cathode or Sn anode) forming a 3D thin-film electrode half-cell of a battery assembly or with a complete cathode/electrolyte/anode thin-film battery stack immediately forming a full battery cell. Such a thin-film battery is described in more details in example 10.

In embodiments, the device may be a semiconductor device comprising a cluster of nanowires according to embodiments of the present disclosure. For instance, the nanowires may be silicon, germanium or III-V semiconductor nanowires, or segmented stacks thereof. In embodiments, the semiconductor device may comprise a cluster of spaced nanowires aligned longitudinally along a direction (X), the cluster comprising at least a first region and a second region positioned subsequently along the longitudinal direction (X), the nanowires of the first region being interconnected and made of metal and the nanowires of the second region being free of interconnections and made of a semiconducting material. In embodiments, the nanowires may abut a substrate. In embodiments where a substrate is present, the second region may be connected to the substrate via a metal layer (e.g. a TiN layer) or a semiconductor layer (e.g. (111) Si). In embodiments, the first region and the second region may be separated by a metal layer (e.g. a gold layer), the metal being different from the metal of the first region. This embodiment is described in more details in example 12.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Example 1: Study of the Inter-Channel Distance Dependence on Anodization Potential FIG. 1 shows a graph of the inter-channel distance (nm) versus the anodizing voltage (V) for various anodizable materials. The data points for pure aluminium are represented by squares. The data points for Al doped with 1 wt % Cu are represented by triangles and the data points for Al doped with 1 wt % Si are represented by circles. As can be seen, all three materials behave in a similar way by forming a similar inter-distance at a similar voltage. Small inter-channel distances ranging between 20 and 50 nm were obtained by using $H_2SO_4$ as an electrolyte under a voltage of from 10 to about 20V. Inter-distances of from about 50 to 125 nm could be achieved in $H_2C_2O_4$ under a voltage of from 20 to about 60V. Larger inter-distances up to 225 nm could be achieved in $H_3PO_4$ for a voltage up to 90V. Note that higher inter-channel distances can be obtained for even higher voltages which are not shown here.

The average inter-channel distance between any two neighbouring channels has been tuned from about 25 nm to about 225 nm by increasing the voltage from 10V to 90V (and by adapting the acid accordingly), where the inter-channel distance is set by the cell voltage applied. The inter-channel distance increased with voltage and appeared independent from the degree of purity and the nature of the impurities in the aluminium.

By performing this experiment, the inventors gained the insight that the inter-channel distance for doped (two different types of doping) and undoped aluminium is the same when the same anodizing conditions are used. This enabled the easy construction of a template comprising an assembly of two contiguous layers, the first layer comprising a network of aligned interconnected channels and the second layer comprising an array or cluster of aligned separated channels, wherein the aligned separated channels are the prolongation of the aligned interconnected channels. The aligned interconnected channels give structural strength to the cluster of nanowires that will be formed from the template. This prevents collapse of the nanowires (e.g. during wet etch of the template).

Example 2: Template 16 Construction

Figure 2:
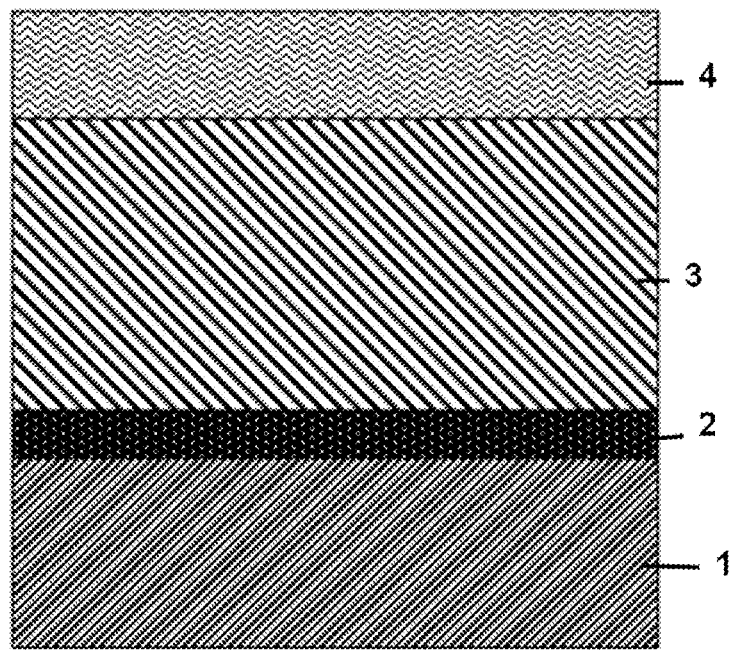
FIGS. 2 to 4 are schematic representations of the end-result of steps according to a method for forming a template according to embodiments of the present disclosure.
Figure 3:
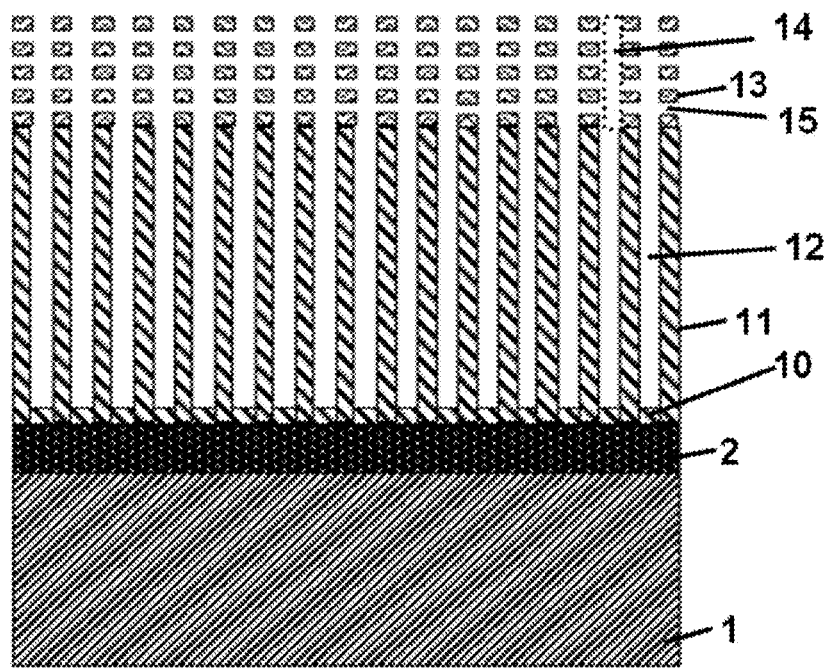
Figure 4:
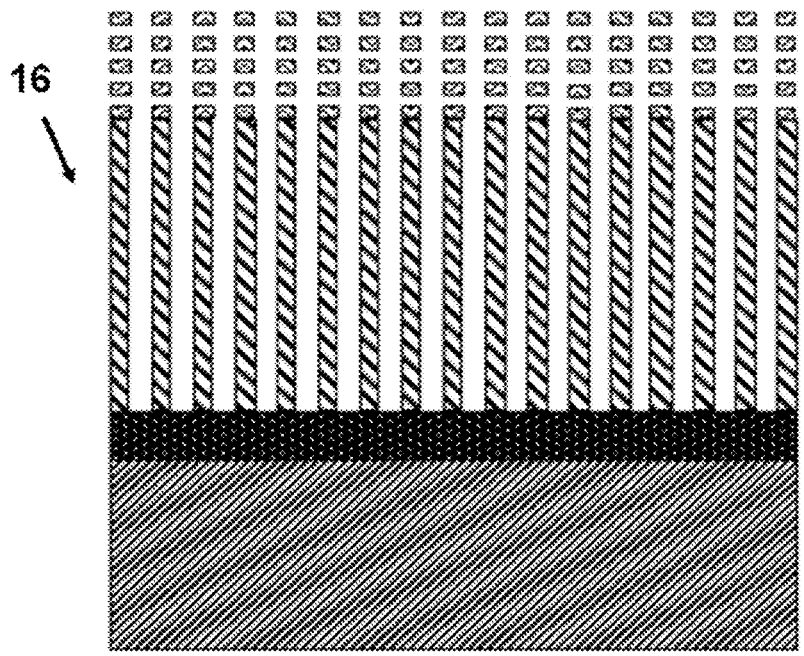
Figure 14:
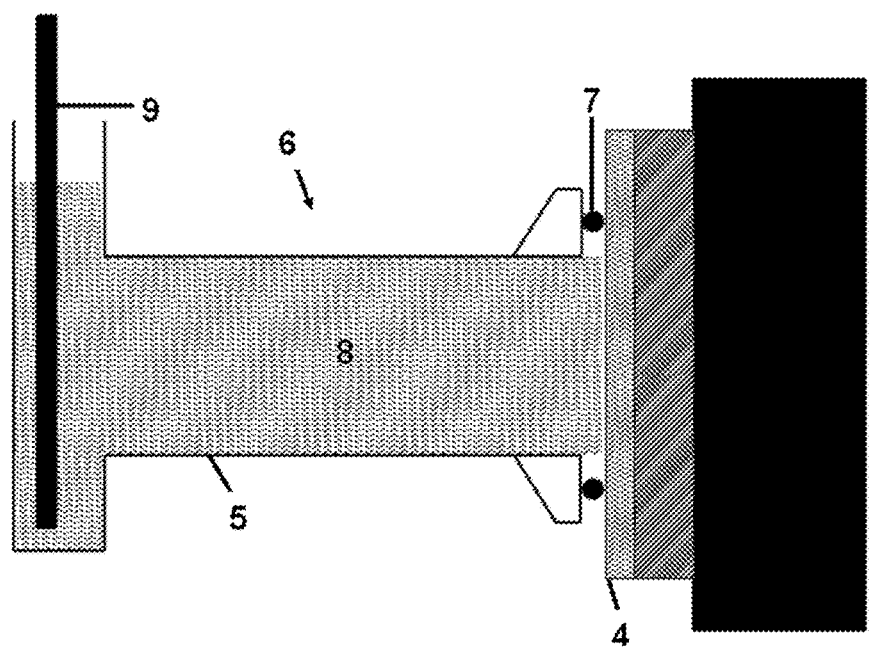
FIG. 14 is a schematic representation of an electrochemical cell as used in embodiments of the present disclosure.

This process is illustrated in FIGS. 2-4. A silicon wafer 1 (200 mm diameter) coated with 100 nm TiN 2 was provided. A pure aluminium layer 3 (2 μm) was provided thereon by physical vapour deposition (PVD). A 500 nm layer of copper-containing aluminium 4 (0.22 at % Cu) was deposited on the pure aluminium layer 3 by PVD. This bi-layer 3, 4 was connected to the bath 5 of an electrochemical cell 6 as indicated in FIG. 14. The bath 5 was connected to the copper-containing aluminium layer 4 via an O-ring 7 assuring tightness. The bath 5 contained oxalic acid 8 (0.3M) as the electrolyte 8 at room temperature and a Ti counter-electrode 9 (5×3.5 cm Ti sheet 9). The copper-containing aluminium layer 4 was used as the working electrode 4. The so-constructed electrochemical cell 6 was put under potentiostatic control (60V) in order to perform anodization of the bilayer 3, 4. The potential was supplied by an AUTOLAB PGSTAT100 and controlled by a Gpes electrochemical software using AUTOLAB voltage multiplier. At completion of the anodization process, the samples were rinsed in de-ionized water and dried in nitrogen gas. The samples so-obtained (FIG. 3) comprised a silicon wafer 1, a TiN layer 2, an aluminium oxide barrier layer 10, an aluminium oxide layer 11 comprising vertical (empty) and aligned separated channels 12, and another aluminium oxide layer 13 comprising vertical (empty) and aligned interconnected channels 14 wherein the aligned separated channels 12 are the prolongation of the aligned interconnected channels 14. The interconnected channels 14 were interconnected by pores 15. The barrier layer 10 was removed and the pores 15 were widened by chemical etching with 0.75 M $H_3PO_4$ at room temperature, resulting in the structure shown in FIG. 4. This step was followed by etching with HF vapor (Pad-fume, Gemetec) at 35° C. to remove any remaining oxide from the TiN surface (removal of the barrier). In this way, the TiN was ready for plating of the metal nanowires in example 3.

Some Variants to Example 2

Example 2 can be repeated with many variations such as for instance the following:
- Al with up to 2% impurities can be used for layer 3 instead of pure Aluminium in so far as these impurities do not lead to the formation of a network of interconnected channels upon anodization. The inventors have noticed that Si is such an impurity. Cu however lead to interconnected channel and should be avoided for the bottom layer,
- Other substrates than the combination Si wafer-TiN layer can of course be used, e.g. Al foil.
- Other electrolytes can be used. For instance sulfuric acid or phosphoric acid can be used.
- Other etchants can be used to clean the surface layer, for example a mixture of peroxide and sulfuric acid can be used instead of HF vapor to clean and prepare the TiN surface.
- Other examples of variants are described in the present description.

Example 3: Cluster Formation within the Template 16

Figure 5:
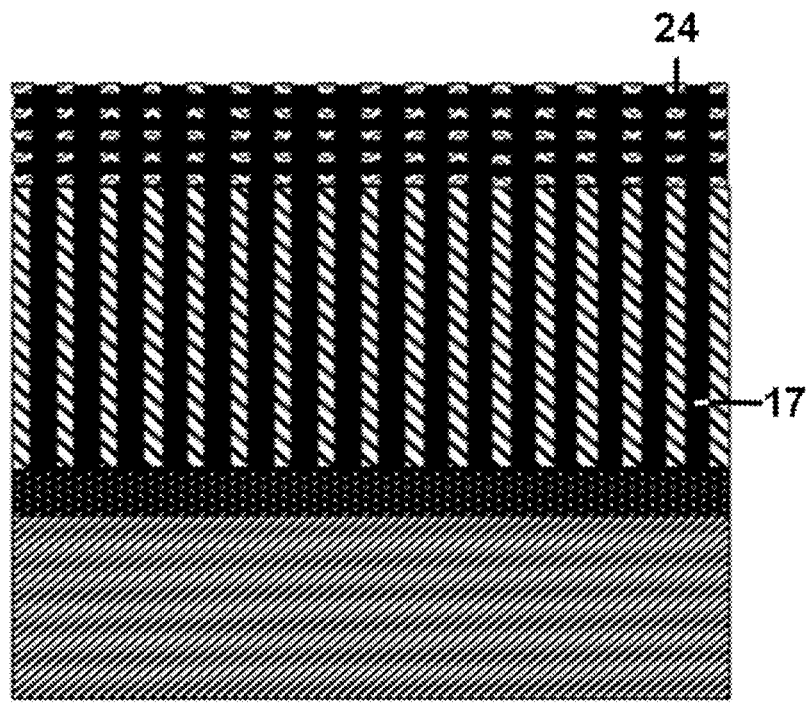
FIGS. 5 and 6 are schematic representations of the end-result of steps according to a method for forming nanowires according to embodiments of the present disclosure.

A two-step galvanostatic electrodeposition (ECD) technique was used to fill in the channels 12, 14 and the pores 15 of the template 16 obtained in Example 2, thereby forming nanowires 17 (FIG. 5). It was performed at room temperature and made use of two steps separated by an off period (0 A) of 10 s. The first step was with an intensity density of −25 mA/cm$^2$ and lasted 0.1 s. the second step had an intensity density of −5 mA/cm$^2$ and was continued until the fill was completed. The end-point was detected by the observed change in potential and by charge. The reference electrode was an Ag/AgCl/3M NaCl (0.22 V vs. SHE) electrode. The counter electrode was an inert platinum gauze. The work electrode was the anodized aluminium oxide (AAO) substrate (AAO/TiN/Si). A nickel sulfamate bath (70 g/L nickel sulfamate, 45 g/L boric acid and 3.5 g/L chloride)) was used for the electrodeposition without agitation. After the plating process, the samples were rinsed in de-ionized water and dried in nitrogen gas.

Some Variants to Example 3

Example 3 can be repeated with many variations such as for instance the following:
- a conventional two electrode cell can be used instead of the Ag/AgCl/3M NaCl and Pt cell configuration described herein,
- any Ni plating bath can be used
- other metals such as copper or compounds such as InSb can be plated.
- single step DC ECD or multiple step pulse plating can be used instead of the two-pulse ECD step
- Other examples of variants are described in the present description.

Example 4: Template Removal

Figure 7:
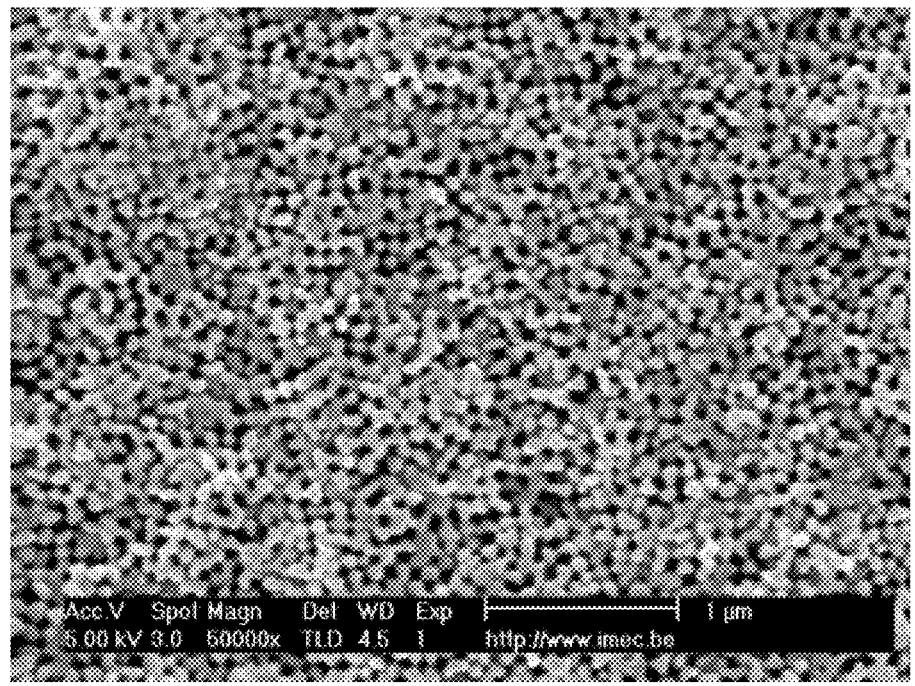
FIG. 7 is a scanning electron microscope image of a top view of a cluster of nanowires according to an embodiment of the present disclosure.

In order to obtain a free cluster of nanowires 17, the AAO template 11, 13 was removed by chemical etching in 3M NaOH solution at room temperature. After etching of the AAO template 11, 13, the samples were rinsed in de-ionized water and dried in nitrogen gas. The obtained cluster of nanowires 17 with interconnections 24 in a first region and free of interconnections in a second region is depicted in FIG. 6 (side-view drawing) and FIG. 7 (top view SEM picture).

Comparative Example 1

Figure 8:
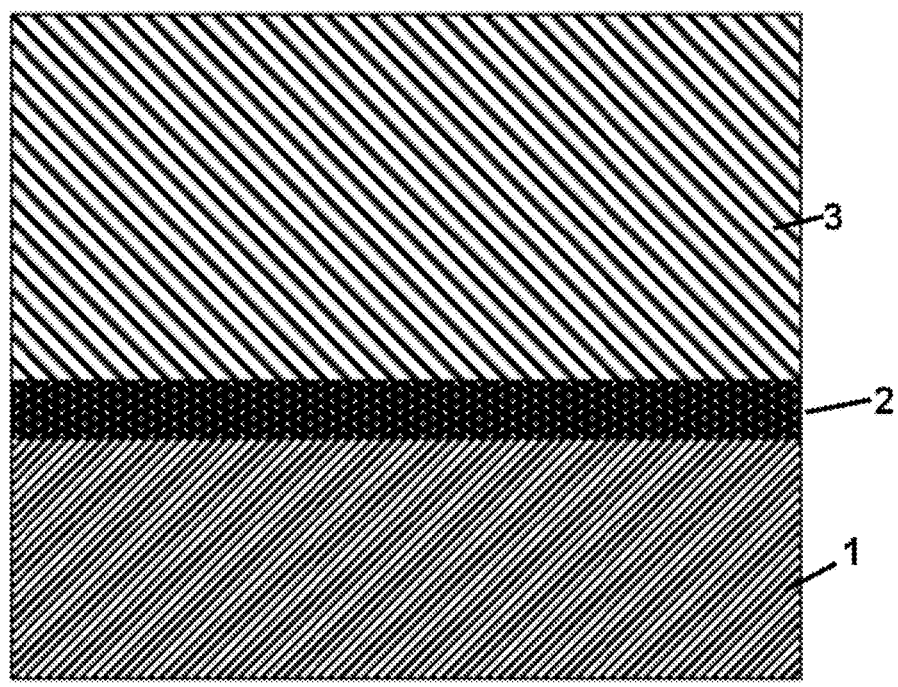
FIGS. 8 to 12 are schematic representations of the end-result of steps according to a method for forming nanowires.
Figure 9:
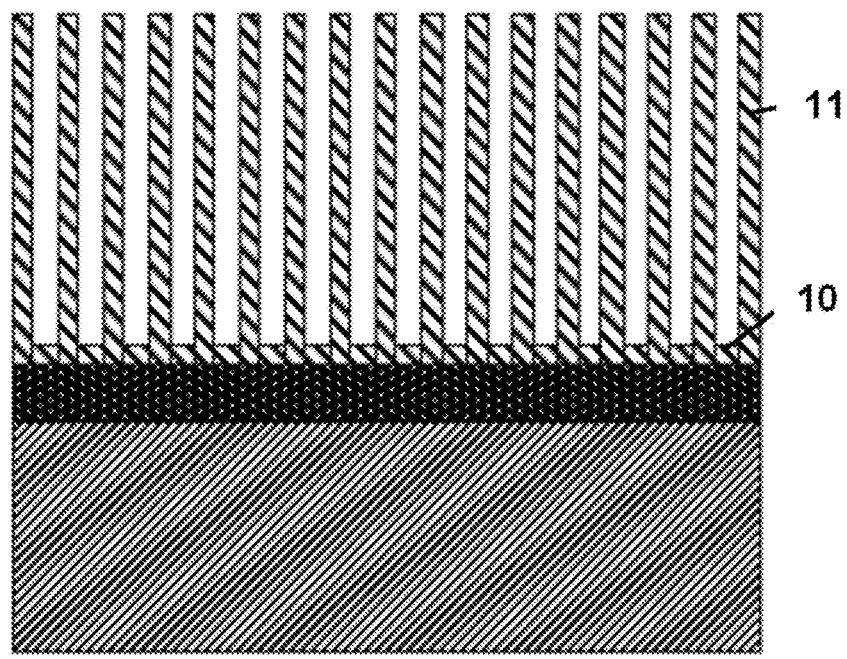
Figure 10:
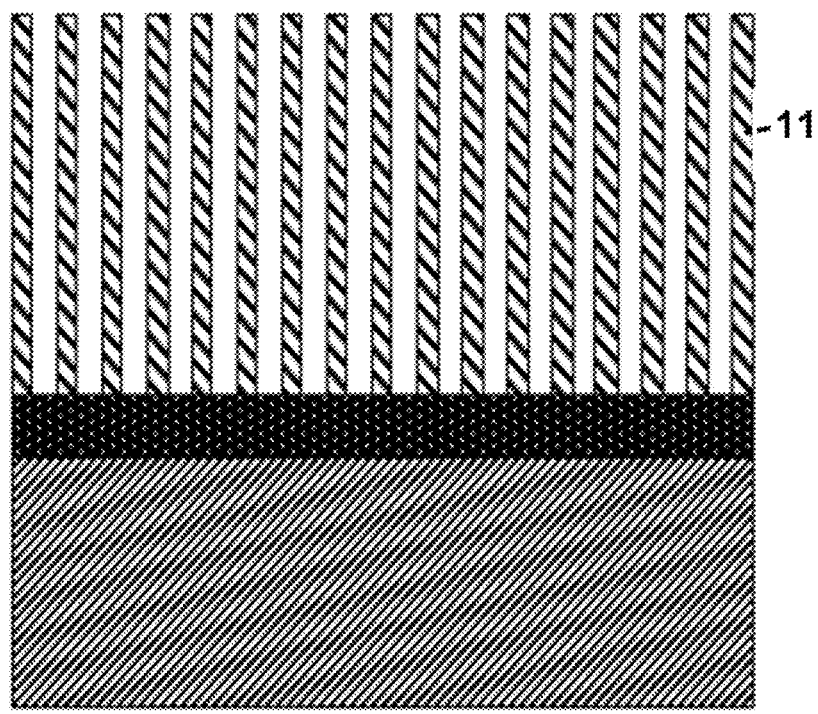
Figure 11:
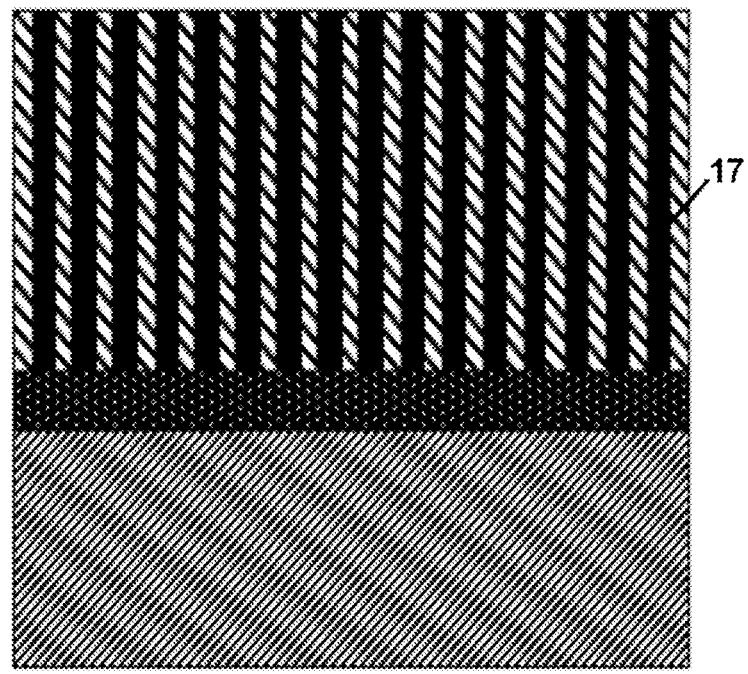
Figure 12:
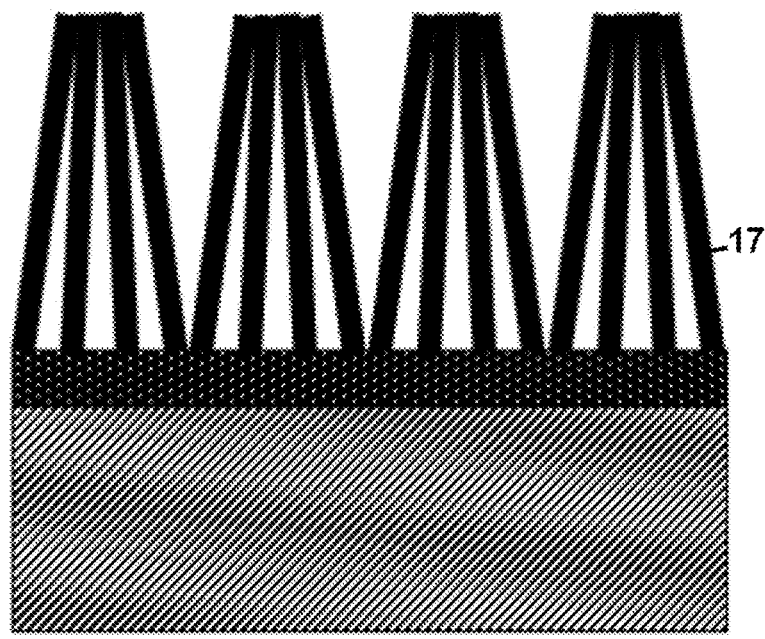
Figure 13:
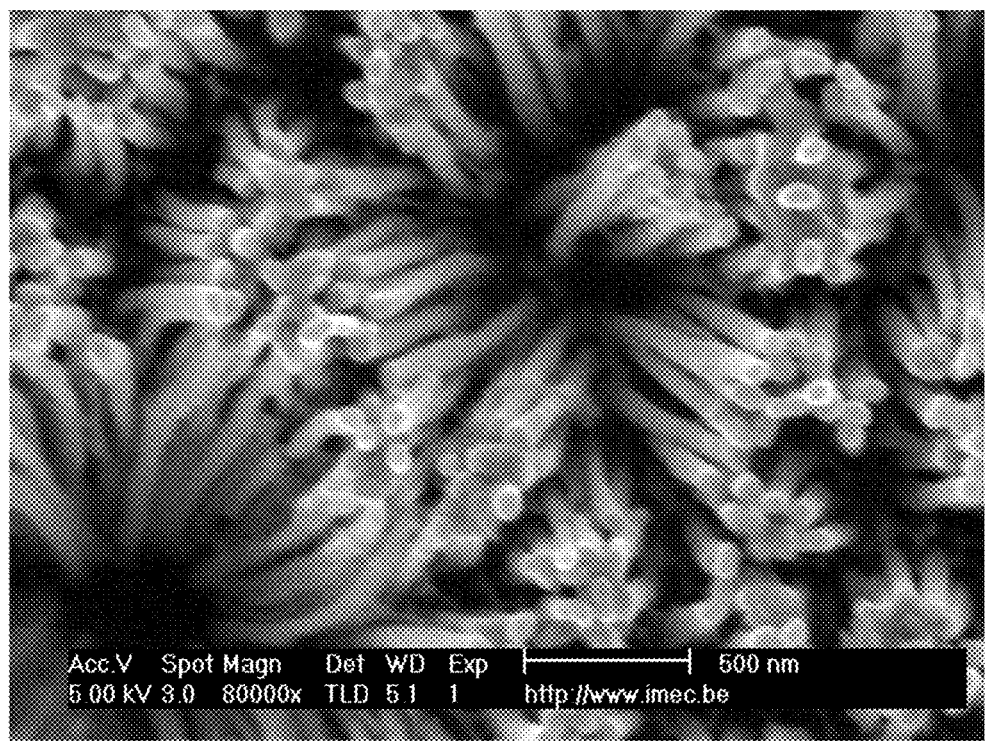
FIG. 13 is a scanning electron microscope image of a top view of a cluster of collapsed nanowires.

Referring to FIGS. 8-12, Examples 2 to 4 were repeated except that instead of forming a bilayer (pure aluminium layer 3 (2 µm)—copper-containing aluminium layer 4 (0.22 at % Cu) (500 nm)), a single layer of pure aluminium 3 (2.6 µm) was deposited on the TiN 2 (see FIG. 8). Galvnostatic anodization was done to form the vertical pore structure as in example 2. Ni was plated as in example 3. The obtained free cluster of nanowires was composed of collapsed nanowires 17 (see FIGS. 12 and 13).

Example 5: Forming an Interconnections-Free Cluster of Non-Collapsed Metal Nanowires Referring to FIG. 15, the cluster of nanowires obtained at the end of example 4 can be used to form a non-collapsed interconnection-free cluster of metal nanowires by the following process. First, SiO$_2$ 19 is deposited via plasma enhanced chemical vapour deposition (PE-CVD) to at least partly fill the openings between the nanowires 17. The quality of the SiO$_2$ can be varied according to methods known to the person skilled in the art. Alternatively, the openings are filled with another material than SiO2, the material having either a functional or a sacrificial purpose as described in examples 6 to 10. Second, chemical mechanical polishing (CMP) is used to remove the interconnected area. CMP of silicon oxide is a standard process known in silicon processing with commercial slurries readily available. The CMP step is continued until the interconnected area is removed. The polishing time will depend on the CMP conditions (pressure, speed) and the thickness of the interconnected layer to remove.

Example 6: Forming a Metal-Insulator-Metal (MIM) Super-Capacitor

Figure 16:
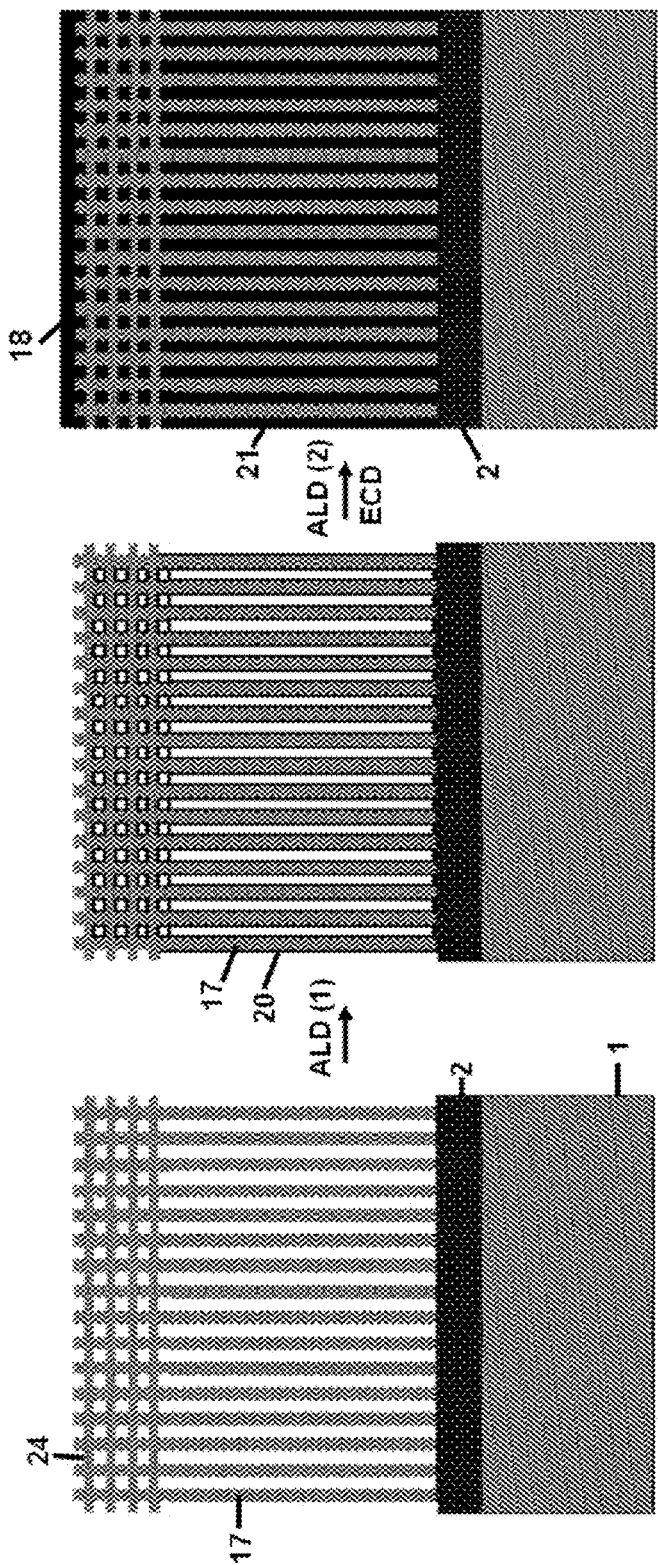
FIG. 16 is a schematic representation of a method for forming a Metal-Insulator-Metal (MIM) super-capacitor according to an embodiment of the present disclosure.

Referring to FIG. 16, the cluster of nanowires 17 obtained at the end of example 4 can be used to form an MIM super-capacitor. First, the cluster of nanowires 17 is coated by a high-k material 20 via ALD (ALD (1)) in order to insulate the metal nanowires 17. Next, a coating of conducting seed is deposited via ALD (ALD (2)) and an electrochemical deposition of a metal 21 is then performed. Alternatively, the metal 21 can be directly deposited by ALD. The TiN layer 2 can then serve as the bottom electrode and the metal 21 at the top can serve as the top electrode 18. The high-K material 20 and the metal 21 are preferably selected so as to have matching work functions to maximize the capacitance while minimizing leakage. Examples of high-k materials 20 that can be used are Al$_2$O$_3$ (AO), HfO$_2$ (HO), ZrO$_2$ (ZO), La$_2$O$_3$(LO) combinations thereof and combinations thereof with SiO$_2$. The ALD(2) layer can be TiN or Ru, both being metals with proper work functions for e.g. a AO/ZO/AO stack, while also serving as conductive seed or catalyst layer for electroplating or electroless plating of e.g. copper or nickel. For the same reasons of work function matching, the metal nanowires might be coated first with a metal layer; e.g. TiN or Ru by ALD. The thickness of the dielectric stack depends on the targeted capacitance and leakage, typically ranging between 2 nm and 30 nm.

Atomic layer deposition (ALD) is the preferred methods because of its capability of forming uniform, thin and conformal films on these high-aspect ratio nanostructures, although also wet chemical techniques can be used.

Figure 17:
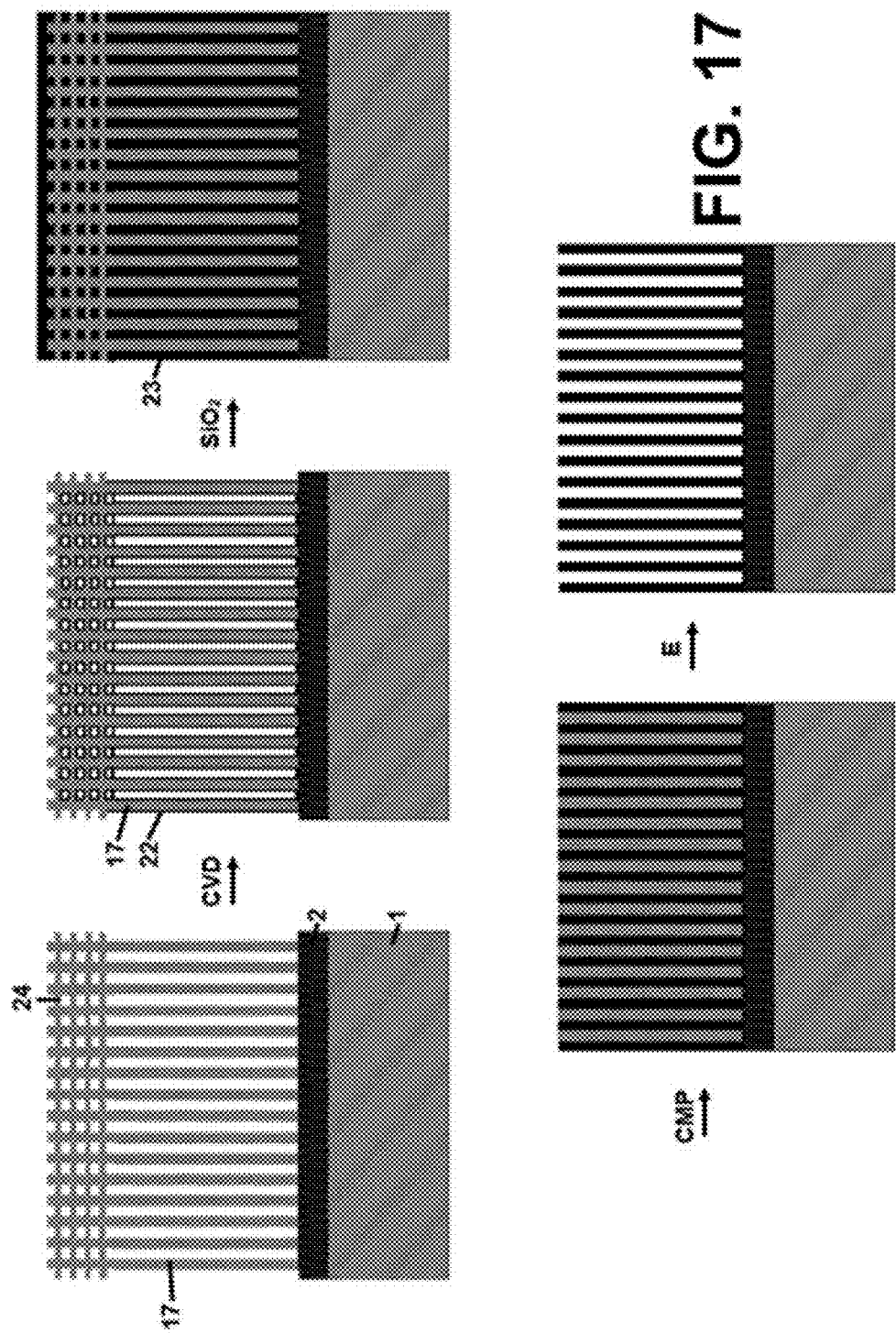
FIG. 17 is a schematic representation of a method for forming narrow dense single wall carbon nanotube (SW-CNT) beds according to an embodiment of the present disclosure.

Example 7: Fabrication of a Narrow Dense Single Wall (SWCNT), Double Wall (DWCNT) or Multi-Wall Carbon Nanotubes (MWCNT) Beds, with Karge Carbon Nanotube Diameter and Inner Diameter Determined by the Metal Nanowire Diameter Referring to FIG. 17, the cluster of nanowires 17 obtained at the end of example 4 can itself be used as a template to form carbon nanotubes. In a first step, the cluster of nanowires 17 is coated with graphene 22 by CVD. When growing single layer graphene, single walled CNTs are obtained, when growing double-layer graphene, double-walled CNTs are made, and when multi-layer graphene or thin layer graphite is grown, multi-layer CNTs are made. The novelty of these engineered CNTs is that the hollow inner diameter is defined by the nanowire diameter. When catalytic CVD of CNTs is performed, the inner-diameter of the CNTs is typically small and single-walled and double-walled CNTs are not larger than a few nanometers in diameter. Using the nanowires as a template, carbon nanotubes with tube inner diameters of 10-100 nm can be fabricated. Next, $SiO_2$ 23 is deposited by PE-CVD or sol-gel techniques in between the coated nanowires 17. Next, the interconnected region is removed by chemical mechanical planarization (CMP), and finally, the metal nanowires 17 are chemically etched (E), leaving only the carbon nanotubes embedded in $SiO_2$ 23. The $SiO_2$ 23 itself can also be etched away to obtain pure carbon nanotubes.

Example 8: Fabrication of Resistive Switching Memory

Figure 18:
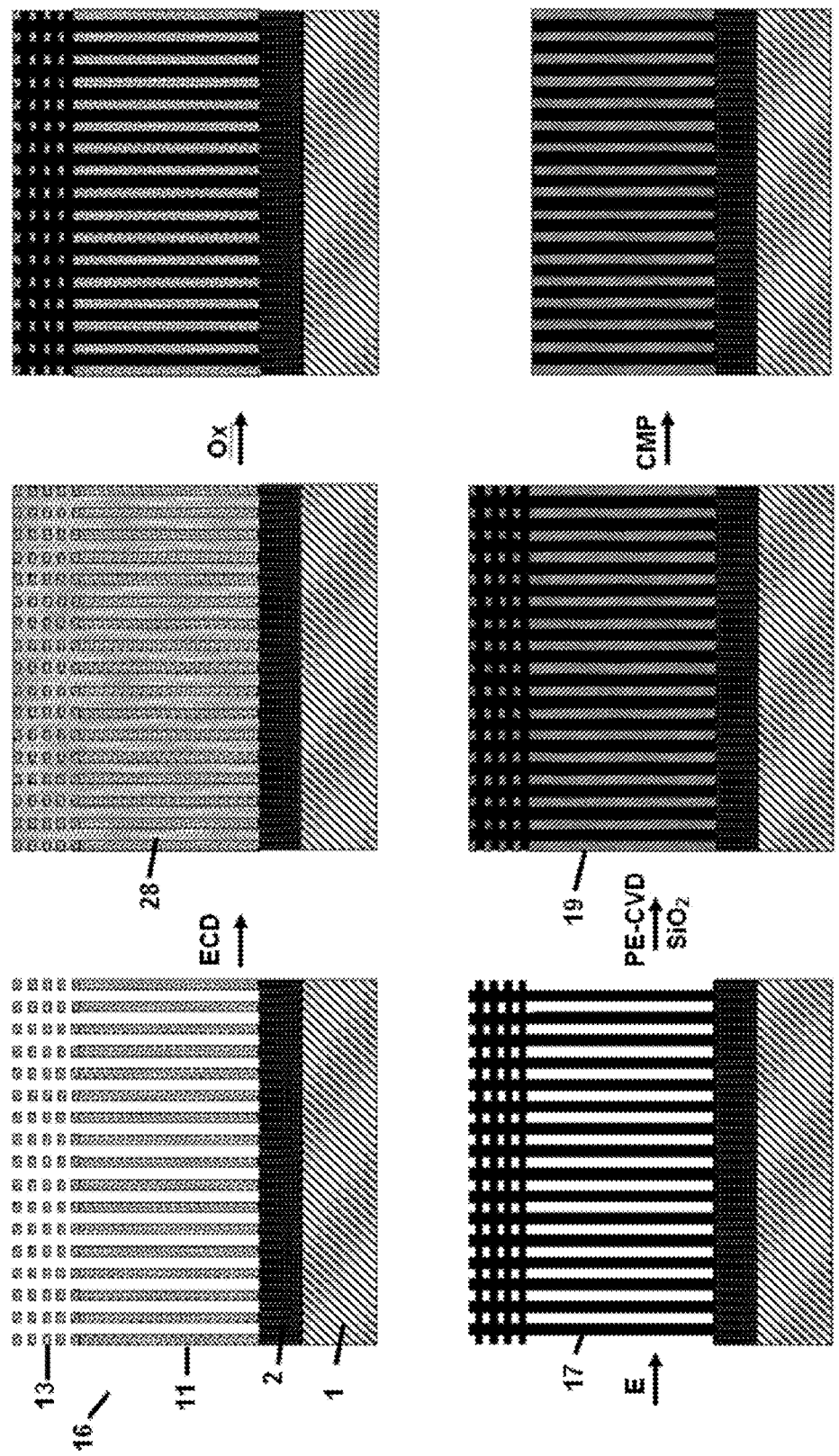
FIG. 18 is a schematic representation of a method for forming resistive switching memory according to an embodiment of the present disclosure.

Referring to FIG. 18, the alumina template 16 obtained at the end of example 2 can serve in the fabrication of a resistive switching memory device. First, Nickel 28 is deposited by electrochemical deposition (ECD) within the template 16. Next, the nickel is oxidized (Ox) into nickel oxide. Next the template 16 is etched by wet etching (E), leaving the oxidized nickel structure. Next, $SiO_2$ 19 is deposited in between the nickel oxide structure via plasma-enhanced chemical vapour deposition (PE-CVD) or sol-gel techniques. Finally, the interconnected region is removed by chemical mechanical planarization (CMP).

Example 9: Fabrication of Magnetoresistive Random-Access Device

Figure 19:
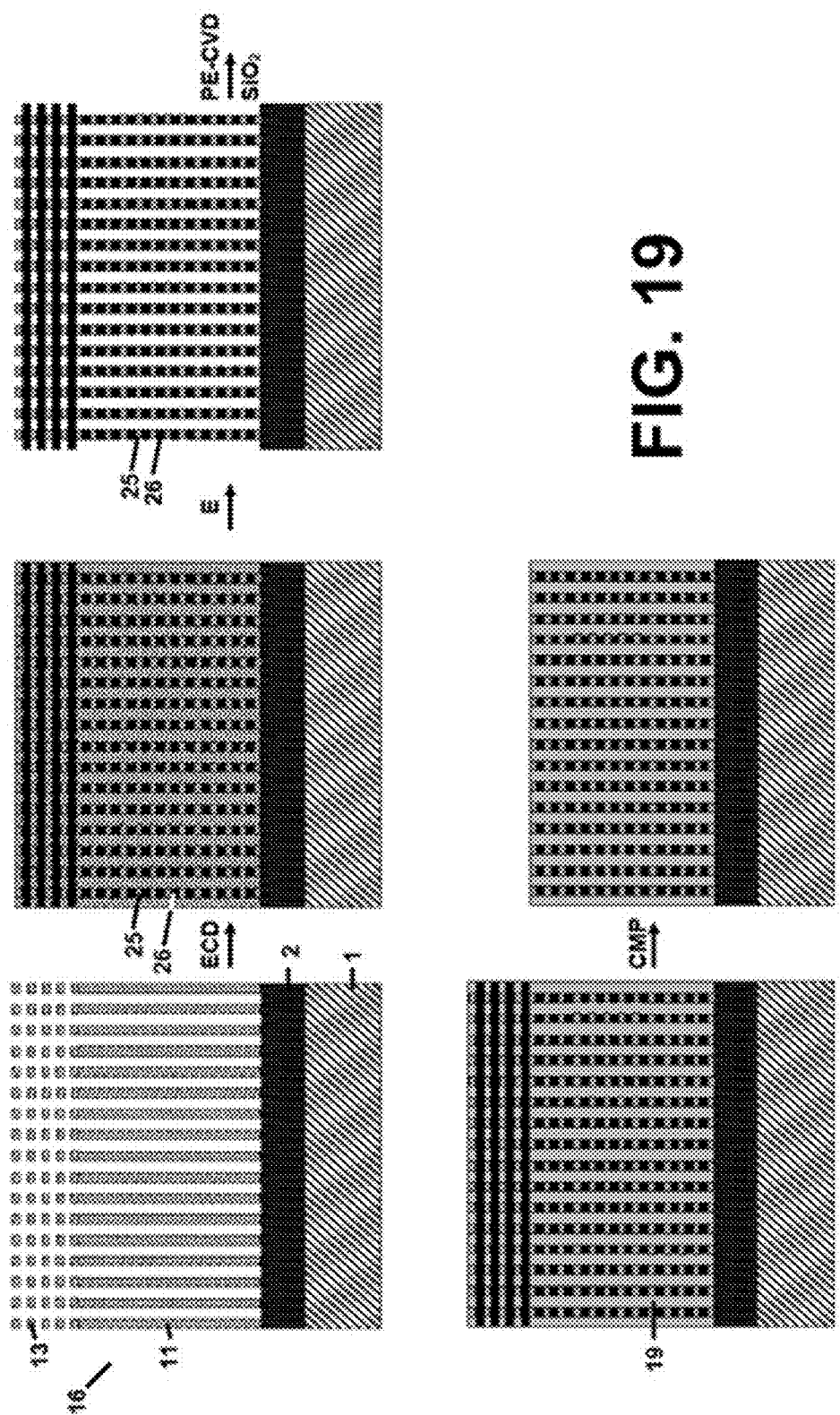
FIG. 19 is a schematic representation of a method for forming a magnetoresistive random-access device according to an embodiment of the present disclosure.

Referring to FIG. 19, the alumina template 16 obtained at the end of example 2 can serve in the fabrication of a magnetoresistive random-access device. First, layers of a magnetic material 25 and layers of non-magnetic metal 26 are deposited alternately in the template 16 thereby forming magnetoresistive nanowires. Next, the template 16 is removed via wet etching (E). Next, $SiO_2$ 19 is deposited between the magnetoresistive nanowires. Finally, the interconnected region is removed by chemical mechanical planarization (CMP).

Example 10: Thin Film Battery on a Foil

Figure 22:
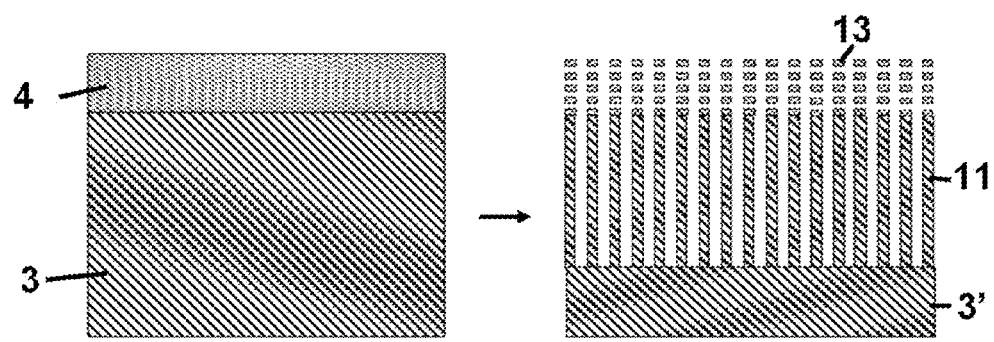
FIG. 22 and FIG. 23 are schematic representations of methods for manufacturing a template according to embodiments of the present disclosure.
Figure 23:
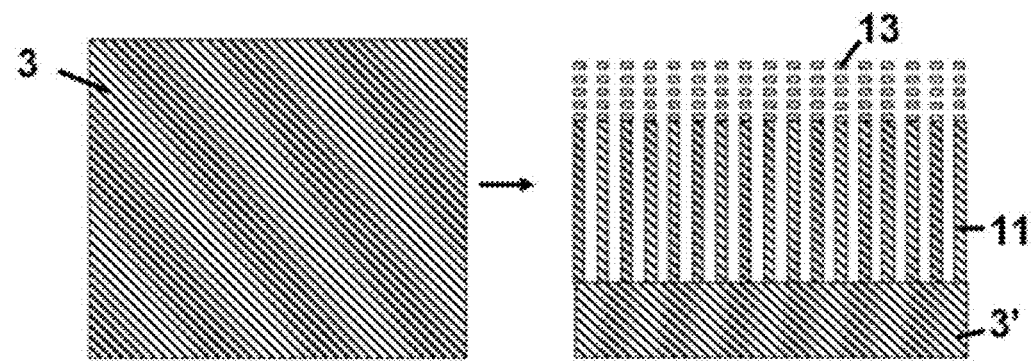

First, an alumina template is formed on a 30-150 µm thick aluminium foil. For this purpose the process of FIG. 22 or FIG. 23 can be used. FIG. 22 shows an aluminium foil 3 overlaid via roll-to-roll sputtering by a 200-1000 nm thick aluminium layer 4 comprising from 0.1 to 5 at % copper. The obtained assembly is then anodized similarly to example 2. However, in the present case, the anodization will be stopped when the remaining thickness of not yet oxidized aluminium foil will be considered adequate for the aluminium foil to serve as a substrate. FIG. 23 shows an aluminium foil 3 which is first anodized by using modulating voltage or current until an aluminium oxide layer of 200-1000 nm thick comprising channels therein is formed. Channel-like pores perpendicular to the longitudinal direction of the channels are then created by chemical etching (e.g. with a $H_3PO_4$ solution such as a 5% $H_3PO_4$ solution). The obtained structure is then anodized under potentiostatic control similarly to example 2. However, in the present case, like in the previous process, the anodization will be stopped when the remaining thickness of not yet oxidized aluminium foil will be considered adequate for the aluminium foil to serve as a substrate.

Independently of whether the process of FIG. 22 or of FIG. 23 is used, at completion of the anodization process, the samples are rinsed in de-ionized water and dried in nitrogen gas. The template so obtained is similar to the template obtained in example 2 except that the substrate is an aluminium foil. Templates on such an aluminium foil are compatible with roll-to-roll processes. This template can then serve to form a nanowire cluster therein as in example 3 and 4. The cluster obtained after template removal can then be coated with electrolytic manganese dioxide, rinsed, and dried. The coated cluster can then be activated by an annealing at a temperature of from 100° C. to 350° C. for a time of from 3 hours to 1 hour. The resulting structure is a three-dimensional thin-film electrode which can be used as a positive electrode in lithium and lithium-ion batteries.

Figure 20:
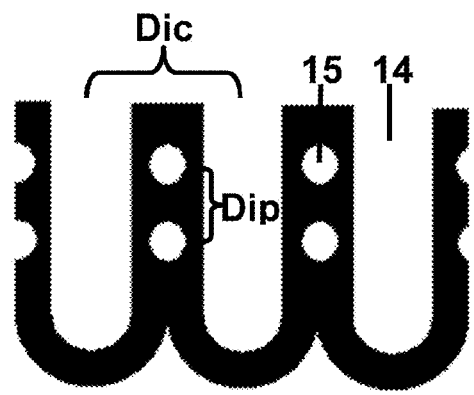
FIG. 20 defines inter-distances between channels (Dic) and pores (Dip) in a template according to embodiments of the present disclosure.
Figure 21:
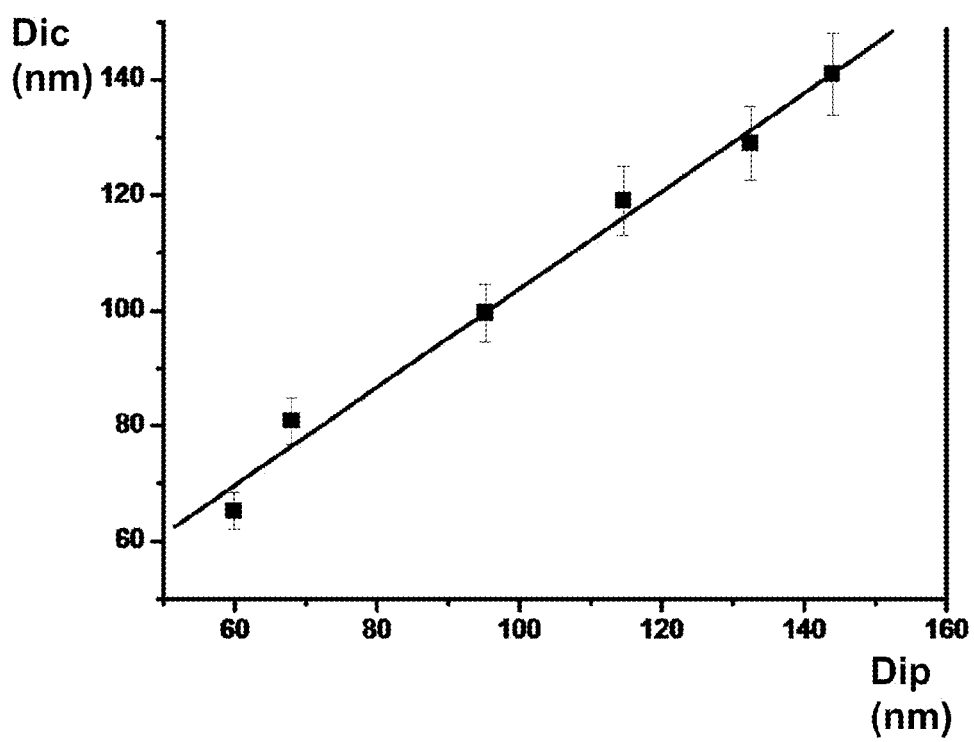
FIG. 21 is a graph of the inter-channel distance versus the inter-pore distance in embodiments of the present disclosure.

Example 11: Determination of the Relationship Between Inter-Pore Distance and Inter-Channel Distance As seen in example 1, the inter-channel distance can be controlled by changing the anodizing voltage. FIG. 21 shows the measured relationship between the inter-channel distance and the inter-pore distance. As can be seen in this figure, both the inter-channel distance (Dic) and the inter-pore (Dip) distance are controlled similarly by the anodizing voltage. The ratio between Dic and Dip is close to unity. FIG. 20 depicts channels and pores as well as the inter-distances between the channels (Dic) and the pores (Dip) in a template according to embodiments of the present disclosure.

Example 12: Fabrication of Semiconductor Device

First, an alumina template is formed on a semiconductor (e.g. Si) substrate. Second, gold is deposited at the bottom of the template by electrochemical deposition or by electroless deposition. Next, Si nanowires are formed in the template by template assisted vapor-liquid-solid (VLS) growth by CVD until the transition between the first (free) and the second (interconnected) layer is reached by the Si material, next gold is deposited on top of the Si nanowires by electroplating or electroless plating. Next, a metal is deposited in the second layer of the template. Wet etching of the alumina provides the semiconductor device.

Example 13: Fabrication of a Nanowire Foil Structure by Delamination

Figure 24:
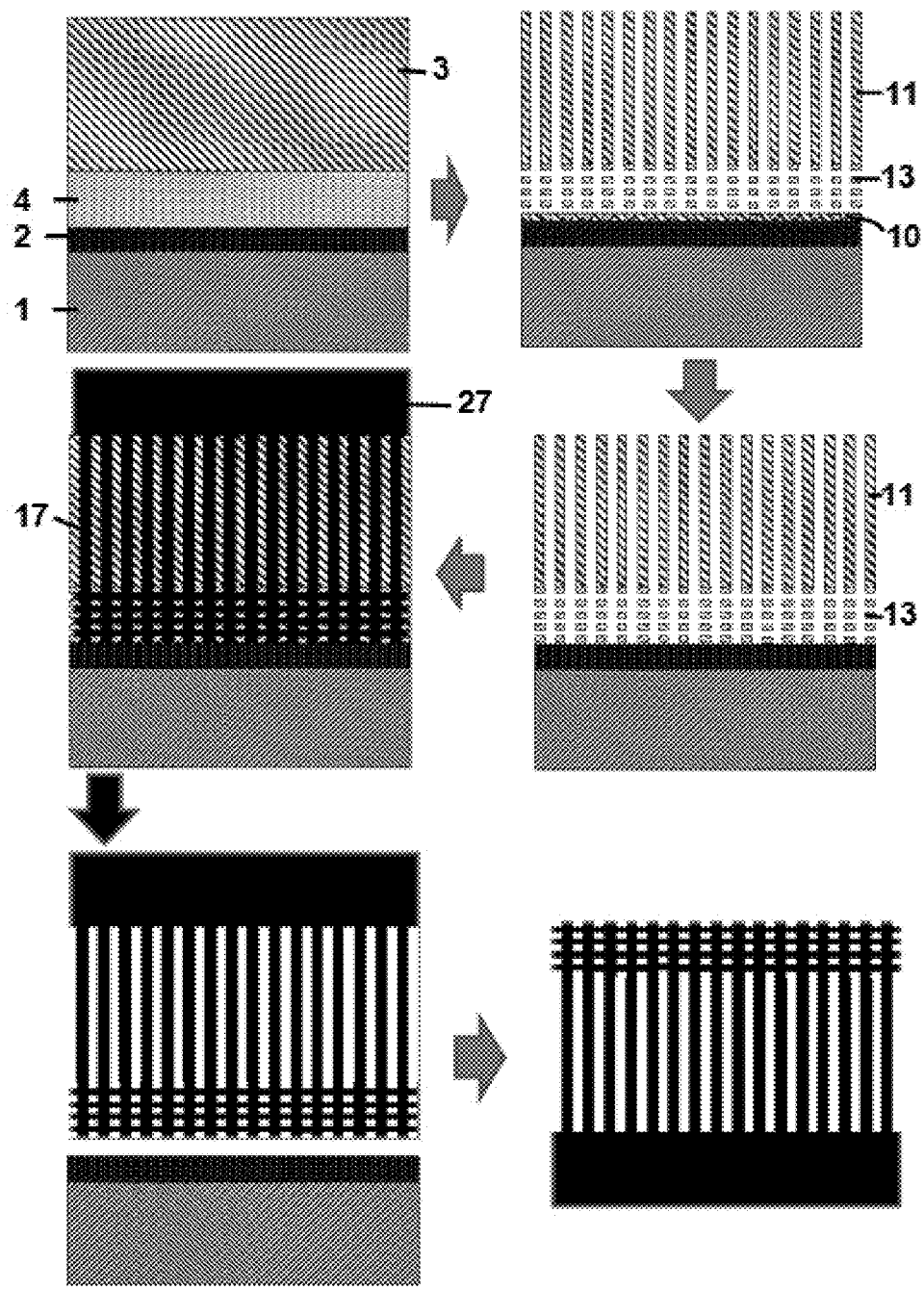
FIGS. 24 and 25 are schematic representations of methods according to embodiments of the present disclosure.
Figure 25:
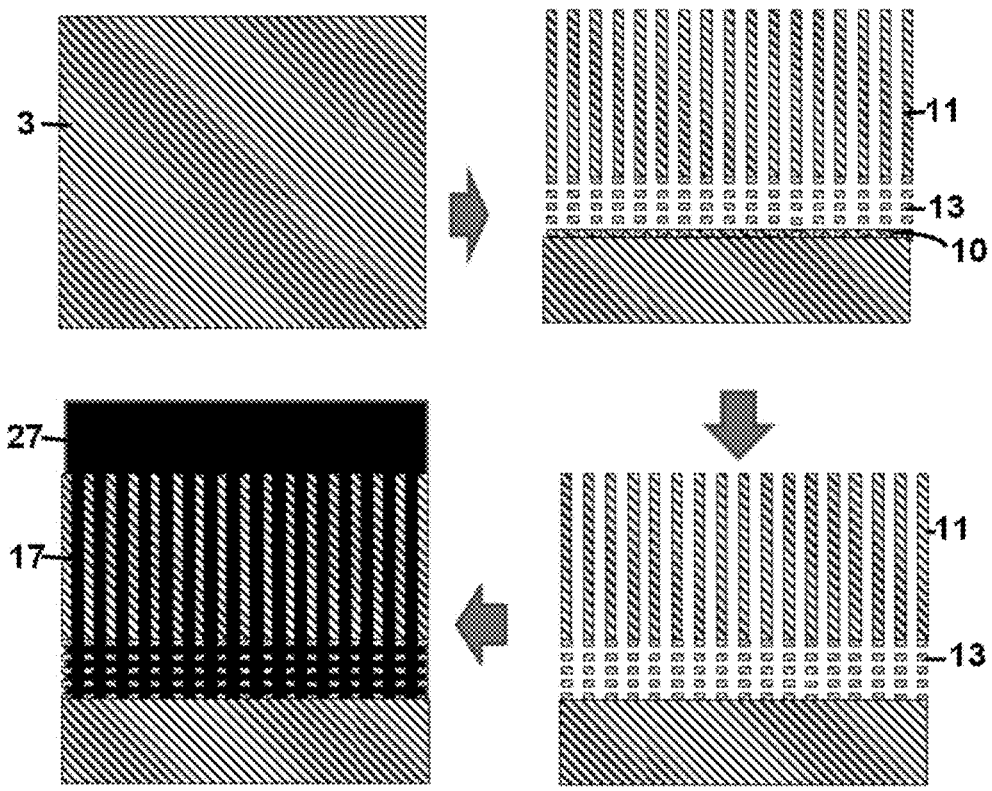

Reference is made to FIG. 24. First, an alumina template is formed in a way analogous to example 2 except that the order of the aluminium containing layers is reversed. The TiN 2 of the substrate is overlayed with 500 nm of copper-containing aluminium 4, which is then itself overlayed with a 2 µm pure aluminium layer 3. The template construction then continues as indicated in example 2. The cluster formation is then performed as in example 3 except that the plating process is continued so as to overplate the nanowires 17 with a metal layer 27 of desired thickness. The anodized aluminium oxide template can then be dissolved, thereby separating the substrate from the metal nanowire cluster. The resulting structure has a metal layer 27 for new substrate. We now refer to FIG. 25. A similar process can be performed by using cyclic anodization (i.e. anodization wherein the voltage or current is cycled or periodically modulated) to create the interconnected region under the vertical channels 17 (made by regular one-step potentiostatic or galvanostatic anodization). This is shown in the first step of FIG. 25. The following steps are identical to the second and following steps of FIG. 24.

It is to be understood that although preferred embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Steps may be added or deleted to methods described within the scope of the present disclosure.

The invention claimed is:

1. A cluster of spaced nanowires aligned longitudinally along a direction, the cluster comprising:
    at least a first region and a second region positioned substantially along the longitudinal direction,
    wherein the nanowires of the first region are interconnected with each other in the first region, and the nanowires of the second region are free of interconnections with each other in the second region.

2. The cluster according to claim 1, wherein the nanowires are not collapsed.

3. The cluster according to claim 2, wherein the first region is interconnected with interconnections made of the same material as the nanowires.

4. The cluster according to claim 1, wherein the nanowires in the second region are a prolongation of the interconnected nanowires of the first region.

5. The cluster according to claim 1, wherein the first region has a length along the longitudinal direction between 20 nm and 1 µm, and the second region has a length along the longitudinal direction of 1 µm or more.

6. A template for forming a cluster of aligned nanowires, the template comprising:
    an assembly of first and second contiguous layers;
    wherein the first layer comprises a network of aligned channels that are interconnected with each other in the first layer, and the second layer comprises a cluster of aligned channels that are separated from each other in the second layer.

7. The template according to claim 6, wherein the aligned separated channels are a prolongation of the aligned interconnected channels.

8. A method for forming a cluster of aligned nanowires, the method comprising:
    forming nanowires in a template according to claim 7.

9. The method according to claim 8, wherein forming nanowires comprises providing a metal in the template.

10. The method according to claim 9, wherein providing the metal is performed by electrochemical deposition.

11. The method according to claim 10, further comprising, after forming the nanowires, dissolving the template.

12. A method for manufacturing a template according to claim 7, comprising:
    anodizing an assembly of first and second contiguous layers, the first layer being made of a material forming a network of interconnected channels upon anodization, and the second layer being made of a material forming a cluster of aligned separated channels upon anodization.

13. The method of claim 12, wherein the anodizing is performed under potentiostatic control in the presence of an electrolyte, and at a temperature of from 0° C. to 50° C.

14. The method according to claim 11, wherein the second layer is made of a material comprising:
    from 98.0 to 100 at % aluminum, and
    less than 0.1 at % copper,
    and wherein the first layer is made of a material comprising from 95.0 at % to 99.9 at % aluminum, and from 0.1 at % to 5.0 at % copper.

15. The method according to claim 14 wherein the material from which the second layer is made comprises at least 99 at % aluminium and less than 0.1 at % copper.

16. A device comprising a cluster of nanowires aligned longitudinally along a direction, the cluster of nanowires comprising at least a first region and a second region positioned substantially along the longitudinal direction, wherein the nanowires of the first region are interconnected with each other in the first region, and the nanowires of the second region are free of interconnections with each other in the second region.

17. The device according to claim 16, wherein the first region has a length along the longitudinal direction between 20 nm and 1 µm, and the second region has a length along the longitudinal direction of 1 µm or more.

18. The template according to claim 6, wherein the first layer has a thickness between 20 nm and 1 µm, and the second layer has a thickness of 1 µm or more.

19. The template according to claim 6, wherein channels in the first layer are interconnected to other channels in the first layer by a plurality of pores.

* * * * *